United States Patent
Morgan et al.

(10) Patent No.: US 7,154,435 B2
(45) Date of Patent: Dec. 26, 2006

(54) SPARSE NUMERICAL ARRAY FEED FOR COMPACT ANTENNA AND RCS RANGES

(75) Inventors: Douglas P. Morgan, Auburn, WA (US); James D. Doty, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 123 days.

(21) Appl. No.: 11/098,862

(22) Filed: Apr. 4, 2005

(65) Prior Publication Data
US 2006/0220950 A1   Oct. 5, 2006

(51) Int. Cl.
*G01S 7/40*   (2006.01)
(52) U.S. Cl. .................. 342/165; 342/169; 342/170; 342/171
(58) Field of Classification Search ........... 342/165, 342/169–174, 368, 375, 377
See application file for complete search history.

(56) References Cited

U.S. PATENT DOCUMENTS

| | | | |
|---|---|---|---|
| 3,879,733 A * | 4/1975 | Hansen et al. | 342/360 |
| 4,218,683 A * | 8/1980 | Hemming | 343/703 |
| 4,553,145 A * | 11/1985 | Evans | 342/360 |
| 4,661,820 A * | 4/1987 | Pouit et al. | 342/351 |
| 4,949,093 A * | 8/1990 | Dhanjal | 343/755 |
| 4,998,112 A * | 3/1991 | Franchi et al. | 342/360 |
| 5,001,494 A * | 3/1991 | Dorman et al. | 343/703 |
| 5,204,685 A * | 4/1993 | Franchi et al. | 342/360 |
| 5,432,523 A * | 7/1995 | Simmers et al. | 343/703 |
| 6,744,400 B1 | 6/2004 | Wei et al. | |

OTHER PUBLICATIONS

"Robust broadband matched-field localization: Results for a short, sparse vertical array", Journal of the Acoustical Society of America, Jul. 1999, vol. 106, No. 1, p. 515-17, 6, Harrison-B-F, Vaccaro-R-J, Tufts-D-W.*

William H. Press, Brian P. Flannery, Saul A. Teukolsky, and William T. Vetterling; Numerical Recipes: The Art of Scientific Computing, chapter 10, Section 10.4 Downhill Simplex Method in Multidimensions, pp. 289-293; Cambridge, United Kingdom, Press Syndicate of the University of Cambridge, 1988.

* cited by examiner

Primary Examiner—John B. Sotomayor
(74) Attorney, Agent, or Firm—Robert R. Richardson, P.S.

(57) ABSTRACT

Systems and methods enable numerically creating a flat field in a compact radar range with a curved reflector, and without use of a separate phased array of elements, at frequencies lower than those that are possible with currently known, reflector-only compact radar ranges. A compact radar range is calibrated to enable weighting factors to be computed. The weighting factors may be computed by performing an optimization algorithm. The weighting factors are used to weight separate target signals sequentially returned from a target zone such that, when combined, a numerically composite measurement has a substantially constant magnitude across the target zone.

20 Claims, 9 Drawing Sheets

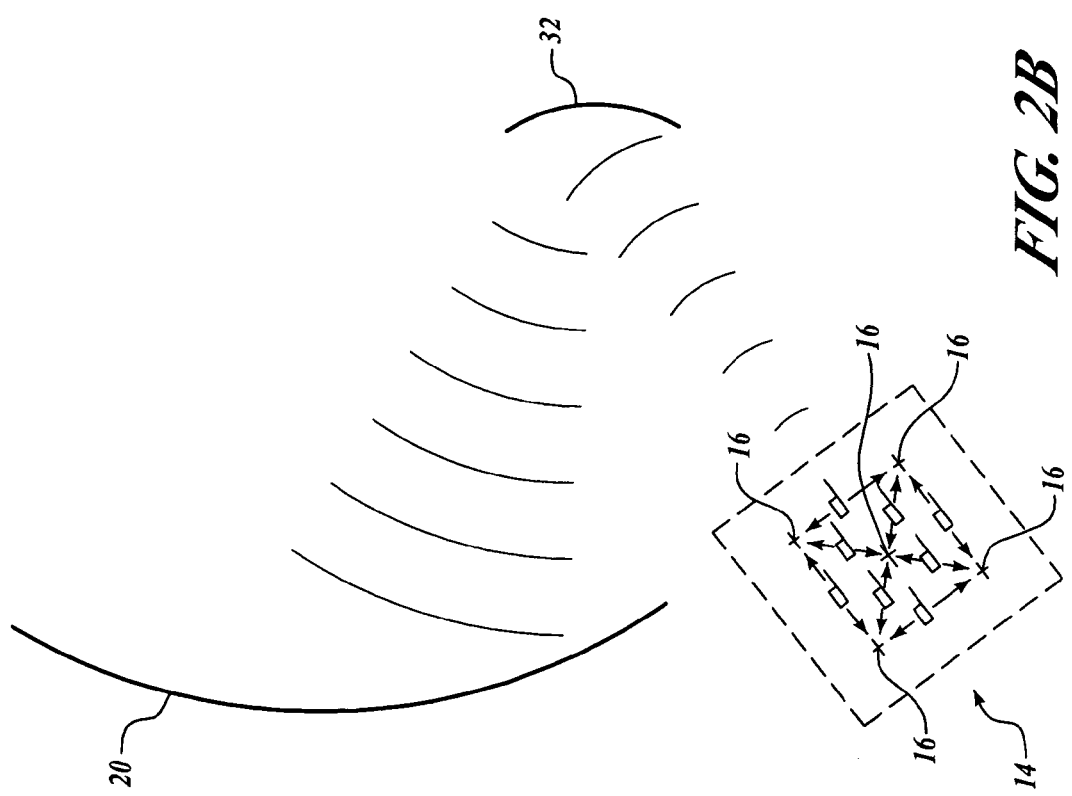

SPARSE NUMERICAL ARRAY FEED FOR COMPACT ANTENNA AND RCS RANGES

STATEMENT REGARDING FEDERALLY SPONSORED RESEARCH OR DEVELOPMENT

This invention was made with Government support. The Government has certain rights in this invention.

FIELD OF THE INVENTION

This invention relates generally to radar ranges and, more specifically, to compact radar ranges.

BACKGROUND OF THE INVENTION

Radar ranges are used for measuring radar cross section (RCS) of platforms and for testing antennas. In a typical radar range, a target is placed in a target zone at a finite distance from a radar source where wave fronts appear flat (that is, a far field condition). For an outdoor (or "free space") range, this distance can be on the order of around 10–15 miles or so.

A desire to reduce the size of radar ranges from the size of outdoor ranges has led to the development of compact indoor ranges (or "compact ranges"). A typical compact indoor range presents in hundreds of feet the same amplitude and phase conditions that an outdoor (free space) range presents in 10–15 miles. Typical compact ranges use frequencies around 1 GHz and above.

In a compact range, an antenna transmits radar waves toward a curved reflector. The incident radar waves induce local perturbations of current on the surface of the curved reflector. The local perturbations of current generate radar waves with flat wave fronts (that is, a flat field) that are emitted from the curved reflector. However, at a finite distance from the curved reflector in a conventional compact range, the flat field diverges due to Huygens principle and begins to appear like a spherical wavefront.

The distance at which the divergence begins is a function of frequency. The test zone field begins to transition from flat to spherical when the diameter of the curved reflector is less than around 5–10 times the wavelength $\lambda$ of the radar waves. Therefore, as frequency decreases, the point at which divergence begins gets closer to the reflector.

For some testing applications, it is desirable to use frequencies, such as around 100 MHz or so, that are lower than those frequencies typically used in conventional compact ranges. However, at some frequency, the flat field could possibly diverge to spherical wavefronts even before the wavefronts arrive at the target zone. Therefore, there is a lower limit to frequency at which far-field conditions can be produced at a fixed target zone in a conventional compact range.

The local perturbations of current are induced over a surface of the curved reflector that spans approximately one-half the radius from the center of the reflector. It is undesirable to use outer surfaces of the curved reflector because diffraction from the edges of the reflector produces ripples in the test zone. Various treatments for limiting the diffraction include serrations, graded-resistive cards, and rolled edges. However, depending on the size of the treatment, the outer edge of the reflector may be kept from contributing to the test zone fields.

As a result, useable size of the reflector may be reduced. Because the transition of the test zone field from flat to spherical begins when the diameter of the curved reflector is less than around 5–10 times the wavelength $\lambda$, the reduction in the useable size of the reflector corresponds to an increase in the lowest frequency of operation.

Dual reflector systems have been employed to provide control over illumination in the test zone. A sub-reflector is used to accurately map a feed pattern onto a main curved reflector. Some reduction in illumination of the main reflector edges may result, thereby providing the same diffraction-reduction benefits as the treatments discussed above. This results in a small increase in useable size of the main reflector (over direct feed without the sub-reflector) and a corresponding decrease in the lowest frequency of operation.

Conventional compact ranges have been considered unusable below the lowest frequency achievable with a sub-reflector. As a result, testing below such frequencies has been performed at outdoor (free space) ranges at high cost.

Another approach to testing applications considered too low for conventional (that is, reflector-only) compact ranges uses a phased array in the compact range instead of the curved reflector. In one example, a two-dimensional (16 element×16 element) phased array about the same size as the curved reflector is placed in a compact range in front of the curved reflector. Amplitude and phase of the elements of the phased array are adjusted such that wave fronts are flat at the target zone.

To use the phased array at relatively high frequencies such as around 400 Mhz in a compact range, the two-dimensional array would have to include thousands of elements. The costs for such an array are not feasible and useable bandwidth is limited to around one-half octave. Thus, such a phased array is not a viable option at such relatively high frequencies. Instead, use of the phased array is limited to frequencies considered too low for the curved reflector.

The phased array must be positioned in place in front of the curved reflector for use. Likewise, the phased array must be removed from its position in front of the curved reflector when the phased array is not in use. As a result, time and labor costs are introduced for setting up, aligning, and storing the phased array. Also, facility resources are required for storage and transport of the phased array.

Therefore, it would be desirable to create a flat field in a compact range with a curved reflector, and without use of a separate phased array of elements, at frequencies lower than those that are possible with currently known, reflector-only compact ranges.

SUMMARY OF THE INVENTION

Embodiments of the present invention provide systems and methods that enable numerically creating a flat field in a compact radar range with a curved reflector, and without use of a separate phased array of elements, at frequencies lower than those that are possible with currently known, reflector-only compact radar ranges. Embodiments of the present invention can provide for savings of facility and labor costs associated with a phased array, and can provide multi-octave frequency bandwidth instead of a phased array's frequency bandwidth of one-half octave. Embodiments of the present invention can be used in compact radar ranges with direct feeds or dual-reflector (that is, sub-reflector and main curved reflector) systems. Advantageously, embodiments of the present invention can be retrofitted to existing compact ranges, thereby enabling lowering of the operating frequency of the existing compact ranges, possibly by a factor of ten or more.

According to one embodiment of the present invention, a compact radar range is calibrated to determine weighting factors. A radar field is sequentially probed in a target zone in a compact radar range with a plurality of spatially spaced-apart radar waves propagated from a plurality of spaced apart antenna element locations off a curved reflector. The plurality of radar waves has a predetermined wavelength. A plurality of multiplier weighting factors for the plurality of antenna element locations are computed using field probe data such that a composite magnitude of the field probe for all the antenna element locations is substantially constant across the target zone.

According to an aspect of the present invention, the weighting factors may include complex multipliers for magnitude and phase. The plurality of weighting factors may be computed by performing an optimization algorithm.

According to another embodiment of the present invention, far field radar conditions are numerically emulated in a compact radar range using the weighting factors. A plurality of spatially spaced-apart radar waves are sequentially propagated off a curved reflector toward a target in a target zone of a compact radar range, and a plurality of target signals are generated. All of the plurality of radar waves have a predetermined wavelength. A plurality of predetermined weighting factors are applied to magnitudes of the plurality of target signals to create a plurality of weighted magnitudes, and the plurality of weighted magnitudes are numerically combined to generate a composite magnitude that is substantially constant across the target zone.

According to another aspect of the present invention, the plurality of spatially spaced-apart radar waves may be transmitted from the plurality of locations toward a sub-reflector and are reflected off the sub-reflector toward the curved reflector. Alternately, the plurality of spatially spaced-apart radar waves may be transmitted directly from the plurality of locations toward the curved reflector.

According to a further embodiment of the present invention, a system for numerically creating far field radar conditions in a compact radar range includes a radar transceiver. At least one antenna element is in signal communication with the radar transceiver and is configured to sequentially transmit a plurality of radar waves from a plurality of spaced-apart locations. All of the plurality of radar waves have a predetermined wavelength. A curved reflector is configured to reflect the plurality of spatially spaced-apart radar waves toward a target in a target zone of a compact radar range. A plurality of target signals are sequentially returned from the target. A processor is operatively coupled to the radar transceiver and is configured to receive the plurality of target signals. The processor includes a first component configured to apply a plurality of predetermined weighting factors to magnitudes of the plurality of target signals to create a plurality of weighted magnitudes. The processor further includes a second component configured to numerically combine the plurality of weighted magnitudes to generate a composite magnitude that is substantially constant across the target zone.

According to a further aspect of the present invention, the processor may further include a third component configured to cause the plurality of antenna elements to be sequentially placed in signal communication with the radar transceiver. A plurality of spaced-apart antennas may be disposed at the plurality of locations. Alternately, one antenna element may be sequentially disposed at the plurality of locations. The plurality of locations may be spaced apart by at least one-half the predetermined wavelength.

BRIEF DESCRIPTION OF THE DRAWINGS

FIG. 2B schematically illustrates reflection of a feed from an exemplary sparse array source off a sub-reflector to a curved reflector;

DETAILED DESCRIPTION OF THE INVENTION

By way of overview, embodiments of the present invention provide systems and methods that enable numerically emulating far field conditions in a compact radar range with a curved reflector, and without use of a separate phased array of elements, at frequencies lower than those that are possible with currently known, reflector-only compact radar ranges. According to one embodiment of the present invention, a compact radar range is calibrated to determine weighting factors. According to another embodiment of the present invention, far field radar conditions are numerically emulated in a compact radar range using the weighting factors.

Figure 1:
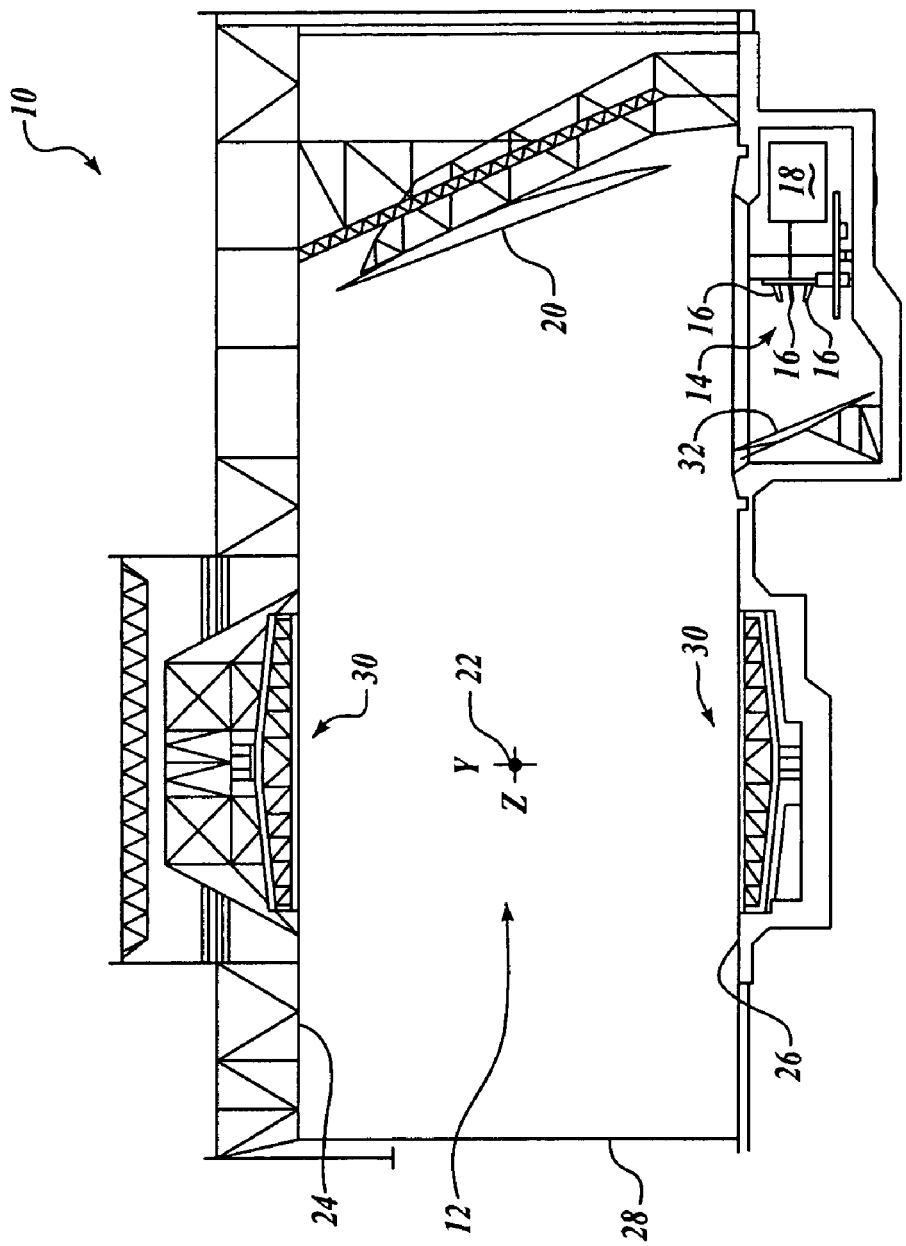
FIG. 1 is a cross sectional view of an exemplary compact radar range that incorporates a system according to an embodiment of the present invention.

Still by way of overview and referring now to FIG. 1, in an exemplary embodiment of the present invention a compact radar range 10 is calibrated to determine weighting factors. A radar field is sequentially probed in a target zone 12 with a plurality of spatially spaced-apart radar waves. The radar waves are propagated from a sparse array 14 of spaced-apart antenna elements 16, in signal communication with a radar system 18, off a curved reflector 20. All of the plurality of radar waves have a predetermined wavelength $\lambda$. A plurality of multiplier weighting factors for the plurality of antenna elements 16 are computed using field probe data such that a composite magnitude of the field probe for all the antenna elements 16 is substantially constant across the target zone 12.

Still by way of overview and still referring to FIG. 1, in another exemplary embodiment of the present invention far field radar conditions are numerically emulated in the compact radar range 10 using the weighting factors. A plurality of spatially spaced-apart radar waves are sequentially propagated off the curved reflector 20 toward a target 22 in the target zone 12, and a plurality of target signals are generated. All of the plurality of radar waves have the predetermined wavelength $\lambda$. A plurality of predetermined weighting factors are applied to magnitudes of the plurality of target signals to create a plurality of weighted magnitudes, and the plurality of weighted magnitudes are numerically combined to generate a composite magnitude that is substantially constant across the target zone 12.

Now that an overview has been established, details of components of the compact radar range 10 and of an exemplary system according to an embodiment of the invention will be discussed. Once such an exemplary host environment and system has been explained, details will be explained regarding calibration of the compact radar range 10 and emulation of far field conditions.

Still referring to FIG. 1, the compact radar range 10 suitably is an indoor, anechoic radar range. The compact radar range 10 is defined by a ceiling 24, a floor 26, an end wall 28, and sidewalls (not shown). If desired, the floor 26 and the ceiling 24 may include turntables 30 for providing motion to the target 22.

The target zone 12 is a space defined by x, y, and z axes. The z axis extends from the curved reflector 20 to the end wall 28. The y axis is orthogonal to the z axis and extends between the ceiling 24 and the floor 26. The x axis is orthogonal to the y and z axes.

The target 22 may include without limitation an antenna for antenna testing or an aircraft, other vehicle, or the like for radar cross section (RCS) measurement. The target 22 may be attached (or flown) in the target zone 12 in a known manner. If desired, the turntables 30 may provide motion to the target 22. During calibration, the target 22 may include a small active antenna or a small passive reflector (scatterer).

Figure 2A:
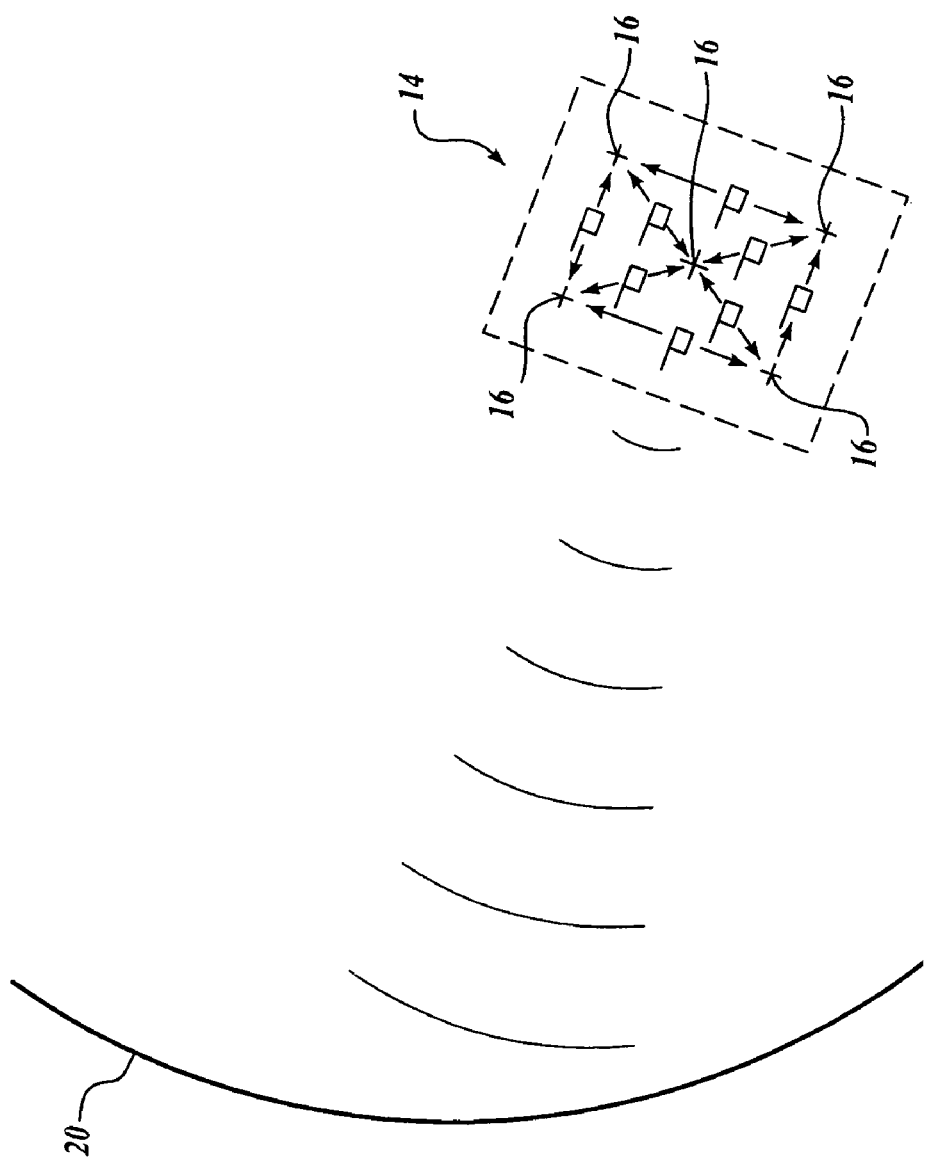
FIG. 2A schematically illustrates a direct feed from an exemplary sparse array source to a curved reflector.

Referring briefly to FIG. 2A, in one embodiment the sparse array 14 suitably directly feeds the radar waves toward the curved reflector 20. In this embodiment, the sparse array 14 is pointed to radiate at the center of the curved reflector 20. The antenna elements 16 are separated from each other by a distance d that is at least one-half the wavelength $\lambda$. As a result of such spacing between the antenna elements 16, a two-dimensional array of the antenna elements 16 is referred to as sparse, e.g., the sparse array 14.

Referring now to FIGS. 1 and 2B, in another embodiment the sparse array 14 suitably transmits the radar waves toward a sub-reflector 32. In this embodiment, the sparse array 14 is pointed to radiate at the center of the sub-reflector 32. The antenna elements 16 are again separated from each other by the distance d that is at least one-half the wavelength $\lambda$. The radar waves are reflected off the sub-reflector 32 toward the curved reflector 20 in a known manner. As discussed above, use of the sub-reflector 32 advantageously results in a small increase in useable size of the curved reflector 20 (over direct feed from the sparse array 14 without the sub-reflector 32) and a corresponding decrease in the lowest frequency of operation for the compact radar range 10.

Referring now to FIGS. 1, 2A, and 2B, the antenna elements 16 may be arranged symmetrically in the sparse array 14 around the focus of the curved reflector 20 (FIG. 2A) or the sub-reflector 32 (FIG. 2B) in any configuration as desired provided that the antenna elements 16 are separated from each other by at least one-half the wavelength $\lambda$. While the antenna elements 16 suitably are arranged symmetrically around the focus of the curved reflector 20 (FIG. 2A) or the sub-reflector 32 (FIG. 2B), the antenna elements 16 need not be centered on the focus of the curved reflector 20 (FIG. 2A) or the sub-reflector 32 (FIG. 2B).

Given by way of non-limiting example and as shown in FIGS. 2A and 2B, five of the antenna elements 16 may be arranged in an "X" configuration. However, the sparse array 14 may include as few as three antenna elements arranged in a triangle configuration. Given by way of further non-limiting example, the sparse array 14 may include nine antenna elements 16 arranged in a three element-by-three element array.

If desired, the sparse array 14 may include only one antenna element 16 that is sequentially moved from one location to another location in a symmetrical pattern around the focus of the curved reflector 20 (FIG. 2A) or the sub-reflector 32 (FIG. 2B). Such a configuration is possible because the field probes and operational measurements are made sequentially. That is, a transmission is made from only one antenna element 16 at a time from any location in the sparse array 14. Use of only one antenna element 16 may lower equipment costs. However, extra time will be entailed in relocating the one antenna element from one location in the sparse array 14 to another location in the sparse array 14. As a result, field probes and operational measurements may take longer than when more than one antenna element 16 is provided in the sparse array 14.

The number and configuration of the antenna elements 16 provided in the sparse array 14 is not critical. An increased number of the antenna elements 16 results in an increase in the number of degrees of freedom and a corresponding increase in the number of possible solutions to the weighting factors. This increases the amount of computing resources entailed in determining the weighting factors, but allows for improved solutions. Therefore, the greater the number of the antenna elements 16 that are provided in the sparse array 14 can provide improved test zone fields, but at a corresponding increase in cost and complexity. Regardless of the number or configuration of the antenna elements 16, the antenna elements 16 should be separated from each other by at least one-half the wavelength $\lambda$ and arranged symmetrically around the focus of the curved reflector 20 (FIG. 2A) or the sub-reflector 32 (FIG. 2B).

The antenna elements 16 may include any type of antenna element as desired for a particular application. For example, the antenna elements 16 may include without limitation: log periodic horizontal and vertical linear polarization antennas, dipole antennas, horn antennas (for any polarization, but typically linear polarization); launcher (Vivaldi) antennas, sinuous antennas, and spiral antennas (for circular polarization). If desired, Yagi antennas may be used, but bandwidth is not as broad for Yagi antennas.

For example, log periodic antennas can support field probes and operational measurements from around 1.1 GHz down to around 90 MHz. A single antenna spacing of around one-half the wavelength $\lambda$ has been validated for frequencies between around 200 MHz to around 400 MHz. At frequencies less than around 200 MHz, the spacing is less than one-half wavelength, and the sparse array 14 may not be "sparse" enough. Conversely, at frequencies greater than around 400 MHz the spacing is greater than one wavelength and the sparse array 14 may be "too sparse". Such a spacing of log periodic linear polarization antennas, therefore, yields a useable frequency bandwidth of around 2:1. When log periodic linear polarization antennas are used, measurements can be made with horizontal and vertical polarization, and a transform to circular polarization can be applied if desired.

Figure 3A:
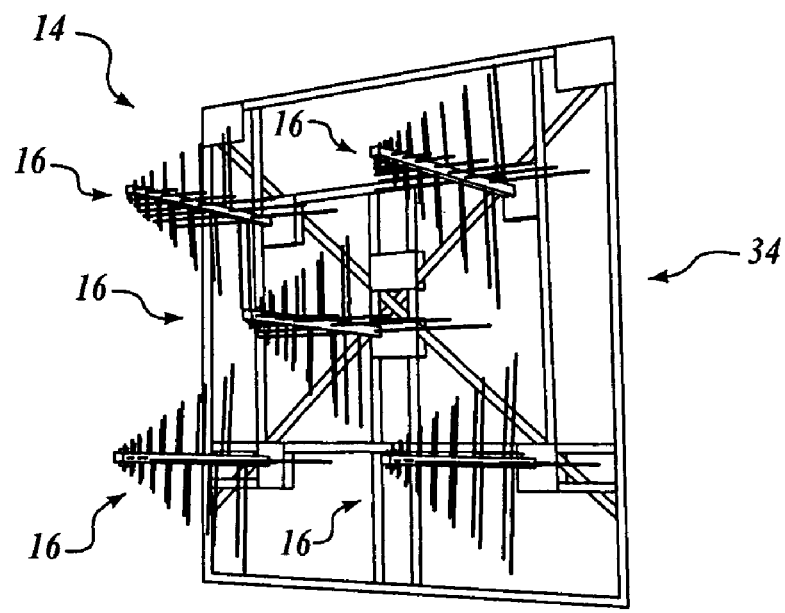
FIG. 3A is a perspective view of an exemplary sparse array.
Figure 3B:
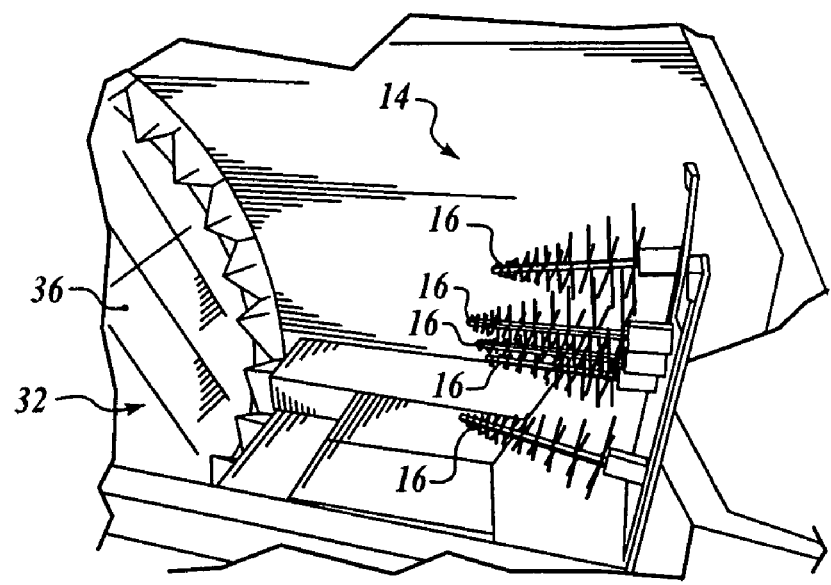
FIG. 3B is a perspective view of the sparse array of FIG. 3A pointed toward a sub-reflector.

Referring now to FIG. 3A, an exemplary sparse array 14 includes five antenna elements 16 arranged in an "X" pattern. The antenna elements are mounted on a support structure 34. Referring now to FIG. 3B, the antenna elements 16 of the sparse array 14 are arranged symmetrically around a focus 36 of the sub-reflector 32.

Figure 4:
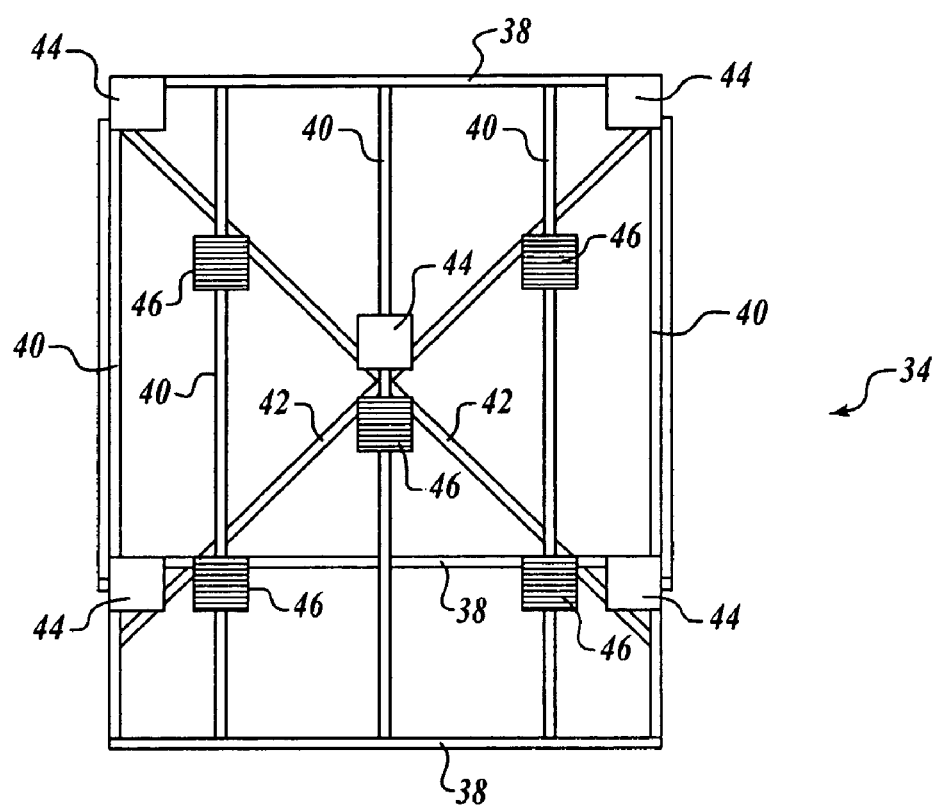
FIG. 4 illustrates an exemplary support structure for a sparse array.

Referring now to FIG. 4, the support structure 34 suitably is a matrix of rows and columns of horizontal support members 38 and vertical support members 40, respectively. If desired for additional stiffening, the support structure 34 may include diagonal brace members 42 that are diagonally disposed between the outermost vertical support members 40.

Advantageously, the support structure 34 can accommodate multiple configurations of the antenna elements (not shown in FIG. 4). Mounts 44, such as pads, brackets, or the like, can receive the antenna elements thereon in any acceptable manner. The mounts 44 are located such that up to five antenna elements can be mounted symmetrically around a focus of the curved reflector (not shown in FIG. 4) or the sub-reflector (not shown in FIG. 4), as desired for a particular application, with a predetermined spacing appropriate for the frequency of operation. If a tighter spacing between the antenna elements is desirable for a particular frequency of operation (as discussed above), then mounts 46 may be provided. The mounts 46 are similar to the mounts 44 but are spaced closer to each other than are the mounts 44.

Figure 5:
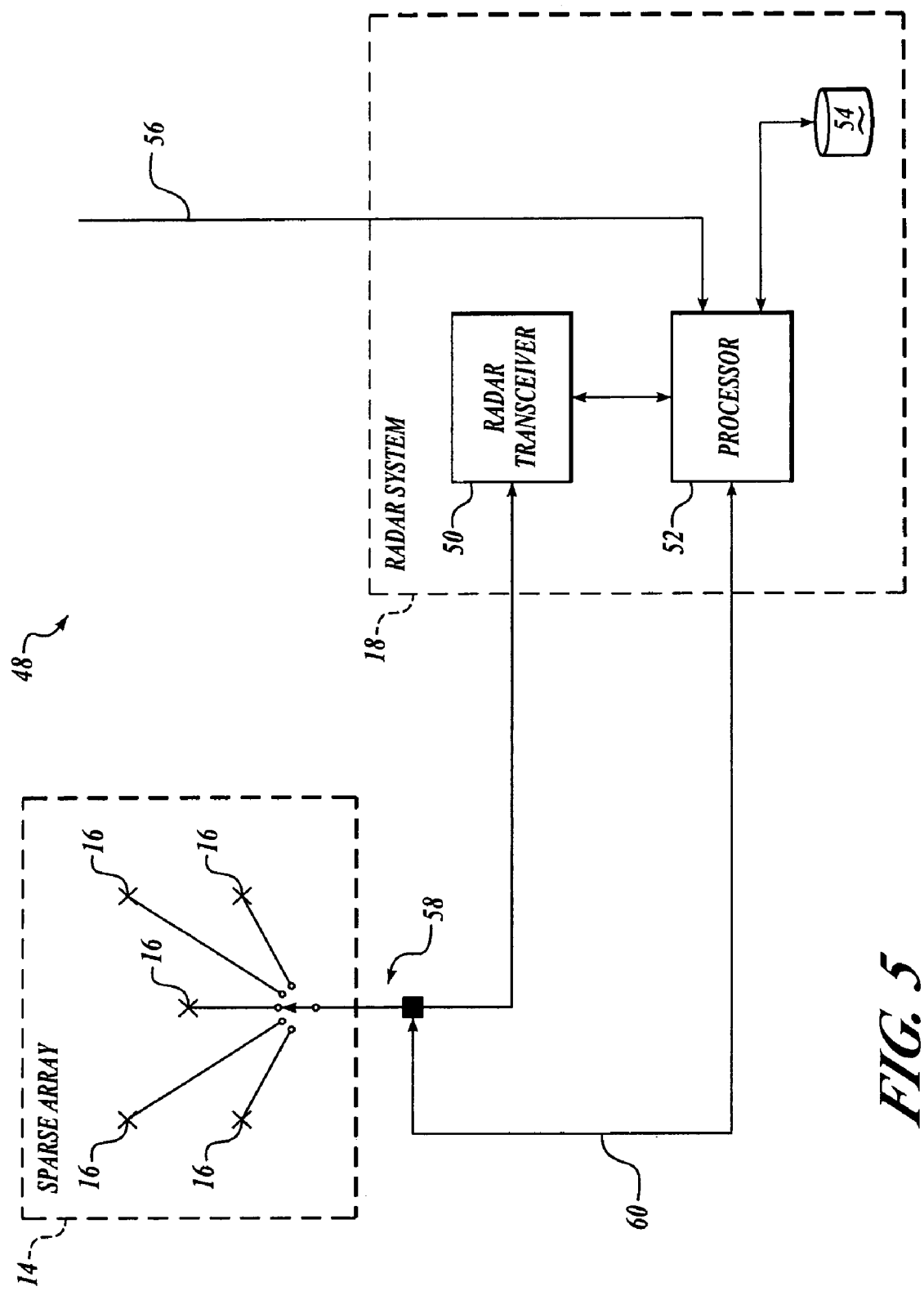
FIG. 5 is a block diagram of a system for calibrating a compact radar range and emulating far field conditions in the compact radar range according to an embodiment of the present invention.

Referring now to FIG. 5, an exemplary system 48 includes the sparse array 14 of antenna elements 16 and the radar system 18. The radar system 18 includes a radar transceiver 50 that operates at any acceptable frequency, pulse width, pulse repetition rate, and scan pattern as desired for a particular application. Given by way of non-limiting example, the radar transceiver may include any acceptable commercially-available radar, such as without limitation an SPC Mk IV radar, a Lintek model 2000 radar, or the like.

The radar transceiver is controlled by a processor 52. The processor 52 is any suitable computer processor or controller, micro-controller, desktop computer, laptop computer, or the like. The processor 52 executes computer software routines that compute the weighting factors and that multiply magnitudes of operational measurement signals by the weighting factors.

Memory storage 54 is coupled to the processor 52. The processor 52 causes the weighting factors to be stored in the memory storage 54 upon computation of the weighting factors. The processor 52 also causes the weighting factors to be retrieved from the memory storage 54 in order for the processor 52 to multiply the magnitudes of operational measurement signals by the weighting factors.

A one-way measurement signal 56 is input to the processor 52 from any acceptable receiver (not shown) located in the compact radar range. The one-way measurement signal is provided when a one-way field probe is performed in connection with antenna testing or when antenna testing is performed. The one-way measurement signal may also be provided when an optional one-way field probe is performed in connection with RCS measurement.

A switch 58 sequentially operatively connects the radar transceiver 50 with the single antenna element that will be used for transmission or reception at any particular time. The switch 58 may be a manually selectable, mechanical switch such as a rotary switch or the like. Alternately, the switch 58 may be a high-speed solid state switch that is electronically selectable by an operator. As a further example, the switch 58 may be controlled by the processor 52 via a control signal 60.

Now that an exemplary host environment has been explained, details will be set forth regarding calibration of the compact radar range 10. After that explanation, emulation of far field conditions will be explained.

Figure 6:
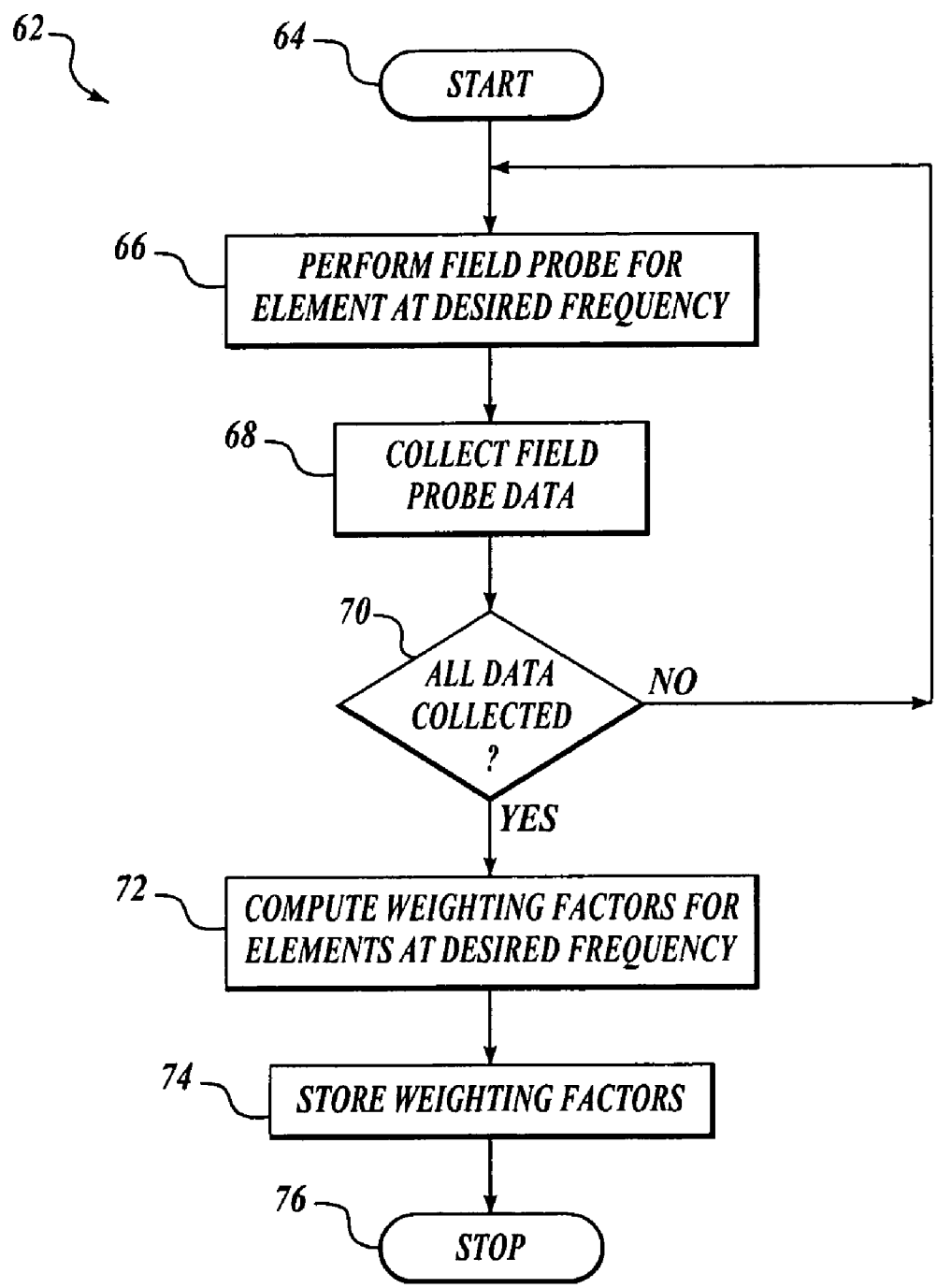
FIG. 6 is a flowchart of an exemplary method of calibrating a compact radar range to generate weighting factors.

Referring now to FIG. 6, a routine 62 for calibrating the compact radar range starts at a block 64. Referring additionally to FIGS. 1 and 5, at a block 66 a field probe of the compact radar range 10 is performed. The field probe is performed while radiating out of one antenna element 16 at the desired frequency for a particular measurement, and field probe data collected is collected. If desired, the field probe may be repeated sequentially while radiating out of the same antenna element but at different frequency. Advantageously, this permits generating field probe data for this antenna element 16 at frequencies that may be used in other measurements. As a result, the field probe can be performed once for the antenna element 16, and need not be repeated in connection with each measurement.

The field probe is performed in any acceptable, known manner. The field probe includes a measurement of fields in the target zone 12 at various locations. The desired size of the target zone must be defined, and this size may vary from facility to facility. The field probe is taken over the entire desired target zone 12 in three dimensions—that is, along the x, y, and z axes. The direction of the target zone 12 along the x direction is referred to herein as "across" the target zone.

The field probe may be conducted one-way, such as by moving a receive antenna along a linear rail (not shown) or other mechanism (not shown). The field probe may also be conducted two-way, such as by moving a reflecting target (such as a sphere or corner reflector) around by strings (not shown) or an absorber-covered linear rail (not shown). For example, an exemplary field probe is disclosed in U.S. Pat. No. 6,744,400 for "System and Method for Evaluating Uniformity of a Wave Field in a Radar Cross Section Test Range" to Wei et al. and assigned to The Boeing Company, the entire contents of which are hereby incorporated by reference.

If the compact radar range 10 is to be used for antenna measurements, then a one-way field probe is performed at the block 66. If the compact radar range 10 is to be used for RCS measurements, then either a one-way field probe or a two-way field probe may be performed at the block 66, as desired.

Field probe data is collected at a block 68. One-way data is provided to the processor 52 as the one-way measurement signal 56 from the receive antenna (not shown). Two-way data is provided to the processor 52 as a radar return received by the antenna element 16 and the radar transceiver 50. The collected field probe data is stored in the memory storage 54.

At a decision block 70 a determination is made whether all field probe data has been collected for all of the antenna elements 16 in the sparse array 14. If not, then the routine 62 returns to the block 66. The switch 58 is caused to be positioned to connect another antenna element 16 of the sparse array 14 to the radar transceiver 50. A field probe is performed as described above for the antenna element 16 that is now selected by the switch 58. The field probe data is collected at the block 68 as described above.

If all the field probe data has been collected for all the antenna elements 16 of the sparse array 14, then at a block 72 weighting factors are computed. The weighting factors are complex multipliers for each antenna element 16 of the sparse array 14. The weighting factors are selected such that, when magnitude of the field probe data at the desired frequency for each antenna element 16 is multiplied by its associated weighting factor and all of the weighted magnitudes of field probe data for all of the antenna elements 16 are combined into a composite magnitude, the composite magnitude is substantially constant across the target zone 12.

The weighting factors are computed using any suitable optimization routine or algorithm, such as without limitation a downhill simplex search, a gradient method, and a Monte Carlo method. The type of optimization routine performed does not affect accuracy of results obtained. However, the type of optimization routine performed does affect how quickly the results are obtained. As a result, in one presently preferred embodiment a downhill simplex search is performed. An exemplary downhill search routine or algorithm is set forth in Section 10.4 of *Numerical Recipes: The Art of Scientific Computing*, William H. Press, Brian P. Flannery, Saul A. Teukolsky, and William T. Vetterling, Cambridge University Press, 1986, the contents of which are hereby incorporated by reference.

A weighting factor, or element weight, w is selected by searching through possible values for w for an optimum solution. The number of optimum solutions that differ by one phase shift may be infinite. Therefore, it is desirable to determine an optimum solution that is a single solution, not an infinite number of solutions. Determining a single optimum solution is made possible by picking one of the antenna elements 16 and setting its weighting factor w to a predetermined or arbitrary value. In one embodiment, a weighting factor w for an antenna element 16 at the center of the sparse array 14 is set to one (1). The values for the other weighting factors w for the other antenna elements 16 of the sparse array 14 are computed as described below. While one or more of the weighting factors w as computed below may have a value of zero, not all of the weighting factors w as computed below will have a value of zero.

The weighting factors w for the antenna elements 16 (that are not set to a predetermined value) are computed by minimizing the following:

$$E = \sum_{n=0}^{N-1} e^{a(r-x_n)}$$

where:

$$x_n = \sum_{m=0}^{M-1} w_{in} p_{mn}$$

N=number of probe positions;
M=number of antenna elements
P=field probe data (position and element)
r=goal ripple;
w=element weight (optimization parameters); and
a=magnifier.

At a block 74 the weighting factors w are stored in the memory storage 54 for use with an antenna measurement or RCS measurement. The routine 62 ends at a block 76.

Figure 7:
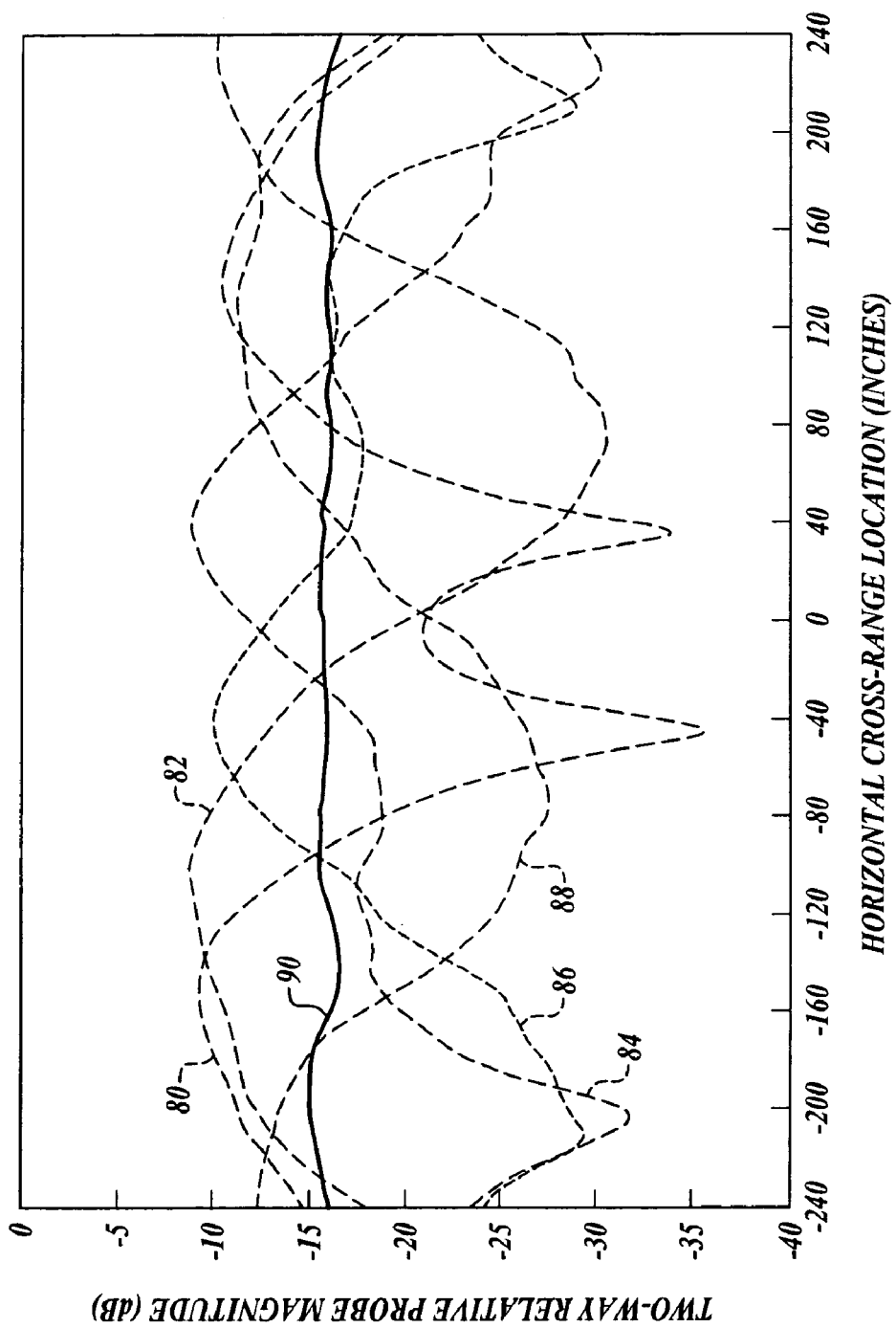
FIG. 7 is a graph of individual field probes and a composite field probe computed by the method of FIG. 6.

Referring additionally to FIG. 7, a graph 78 plots relative field probe magnitude on a y axis versus location across the target zone 12 on an x axis. The data was taken at a frequency of 350 MHz with HH polarization. Lines 80, 82, 84, 86, and 88 represent individual field probes for the antenna elements 16 of the sparse array 14 (in this example, five of the antenna elements 16 were used). A line 90 represents an optimized, composite field probe. The optimized composite field probe has been obtained by computing the weighting factors w for the antenna elements 16 using the field probe data represented by the lines 80, 82, 84, 86, and 88 and by combining the weighting factors w for all of the antenna elements 16. Advantageously, the optimized composite field probe, as shown in the line 90, is substantially constant across the target zone 12.

Figure 8:
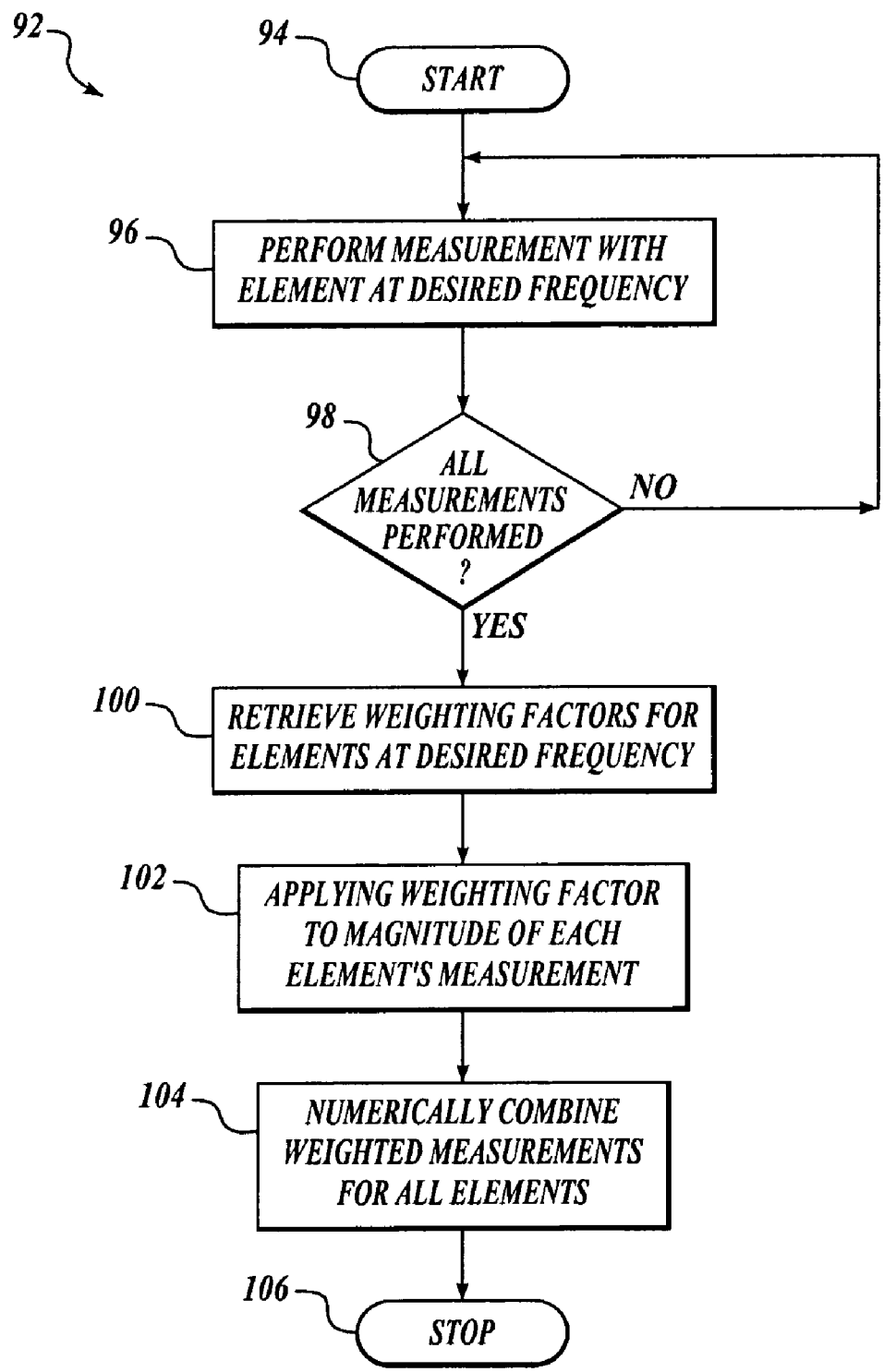
FIG. 8 is a flowchart of an exemplary method of numerically emulating far field conditions in a compact radar range.

Referring additionally to FIG. 8, a routine 92 emulates far field conditions in the compact radar range 10. The routine 92 begins at a block 94. At a block 96 antenna measurements or RCS measurements are performed on the target 22 as described above. Each antenna element 16 of the sparse array 14 is used to sequentially radiate. That is, only one of the antenna elements 16 radiates at any one time. A target signal is returned for each separate, sequential radiation from the antenna elements 16. Measurement data for each of the antenna elements 16 is stored in the memory storage 54.

At a decision block 98 a determination is made whether all of the desired measurements have been made by all of the antenna elements 16 radiating separately in turn. If not, then the routine 92 returns to the block 96. The switch 58 is caused to select another of the antenna elements 16 and the measurement is performed for the now-selected antenna element 16.

If all of the measurements have been made, then at a block 100 the weighting factors w for all of the antenna elements 16 at the desired frequency are retrieved from the memory storage 54. At a block 102, the complex weighting factors w are applied by the processor 52 to magnitude and phase of the measurement data for the antenna element 16 associated with the particular weighting factor.

At a block 104, the weighted measurements for all of the antenna elements 16 of the sparse array 14 are numerically combined by the processor 52. Because the weighting factors w have been applied to the individual measurements and combined into a composite measurement, the composite measurement thus obtained is substantially constant across the target zone 12. While none of the antenna elements 16 have radiated at the same time, advantageously the weighted measurement data obtained by separately radiating from the antenna elements 16 are now combined to emulate far field conditions in the compact radar range 10. The routine 92 stops at a block 106.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method of numerically emulating far field radar conditions in a compact radar range, the method comprising:
    sequentially propagating off a curved reflector a plurality of spatially spaced-apart radar waves toward a target in a target zone of a compact radar range, all of the plurality of radar waves having a predetermined wavelength;
    applying a plurality of predetermined weighting factors to magnitudes of a plurality of target signals sequentially returned from the target to create a plurality of weighted magnitudes; and
    numerically combining the plurality of weighted magnitudes to generate a composite magnitude that is substantially constant across the target zone.

2. The method of claim 1, wherein the plurality of spatially spaced-apart waves are transmitted from a plurality of locations that are spaced apart by at least one-half the predetermined wavelength.

3. The method of claim 1, wherein the plurality of spatially spaced-apart radar waves are transmitted from a plurality of spaced-apart antennas disposed at the plurality of locations.

4. The method of claim 1, wherein the plurality of spatially spaced apart radar waves are transmitted from one antenna that is sequentially disposed at the plurality of locations.

5. The method of claim 1, wherein the plurality of spatially spaced-apart radar waves are transmitted directly from the plurality of locations toward the curved reflector.

6. The method of claim 1, wherein the plurality of spatially spaced-apart radar waves are transmitted from the plurality of locations toward a sub-reflector and are reflected off the sub-reflector toward the curved reflector.

7. The method of claim 1, further comprising retrieving the plurality of weighting factors.

8. A method of calibrating a compact radar range, the method comprising:
   sequentially probing a radar field in target zone of a compact radar range with a plurality of spatially spaced-apart radar waves propagated from a plurality of spaced apart locations off a curved reflector, the plurality of radar waves having a predetermined wavelength; and
   computing a plurality of multiplier weighting factors for the plurality of locations using field probe data such that a composite magnitude of the field probe for all the locations is substantially constant across the target zone.

9. The method of claim 8, wherein the weighting factors include complex multipliers for magnitude and phase.

10. The method of claim 8, wherein computing the plurality of weighting factors includes assigning a predetermined value to one of the plurality of weighting factors and determining non-zero values for at least one other of the plurality of weighting factors.

11. The method of claim 8, wherein computing the plurality of weighting factors is performed by an optimization algorithm that minimizes the equation $$E = \sum_{n=0}^{N-1} e^{a(r-x_n)}$$

where:

$$x_n = \sum_{m=0}^{M-1} w_{in} p_{mn}$$

N=number of probe positions;
M=number of antenna elements
P=field probe data (position and element)
r=goal ripple;
w=weighting factor; and
a=magnifier.

12. The method of claim 11, wherein the optimization algorithm includes one of a downhill simplex search, a gradient method, and a Monte Carlo method.

13. The method of claim 8, further comprising storing the plurality of weighting factors.

14. The method of claim 8, wherein sequentially probing the radar field performs one of a one-way probe and a two-way probe.

15. A system for numerically creating far field radar conditions in a compact radar range, the system comprising:
   a radar transceiver;
   at least one antenna element in signal communication with the radar transceiver and configured to sequentially transmit a plurality of radar waves from a plurality of spaced-apart locations, all of the plurality of radar waves having a predetermined wavelength;
   a curved reflector configured to reflect the plurality of spatially spaced-apart radar waves toward a target zone of a compact radar range; and
   a processor operatively coupled to the radar transceiver, the processor including:
      a first component configured to apply a plurality of predetermined weighting factors to magnitudes of a plurality of target signals sequentially returned from the target to create a plurality of weighted magnitudes; and
      a second component configured to numerically combine the plurality of weighted magnitudes to generate a composite magnitude that is substantially constant across the target zone.

16. The system of claim 15, wherein the plurality of locations are spaced apart by at least one-half the predetermined wavelength.

17. The system of claim 15, wherein the at least one antenna element includes a plurality of spaced-apart antennas disposed at the plurality of locations.

18. The system of claim 15, wherein the one antenna element is configured to be sequentially disposed at the plurality of locations.

19. The system of claim 15, further comprising a sub-reflector configured to reflect the plurality of spatially spaced-apart radar waves from the plurality of locations toward the curved reflector.

20. The system of claim 17, wherein the processor further includes a third component configured to cause the plurality of antenna elements to be sequentially placed in signal communication with the radar transceiver.

* * * * *